US008560932B2

(12) United States Patent
Kleihorst et al.

(10) Patent No.: US 8,560,932 B2
(45) Date of Patent: Oct. 15, 2013

(54) DIGITAL SYSTEM AND A METHOD FOR ERROR DETECTION THEREOF

(75) Inventors: Richard Petrus Kleihorst, Eindhoven (NL); Adrianus Johannes Maria Denissen, Eindhoven (NL); Andre Krijn Nieuwland, Eindhoven (NL); Nico Frits Benschop, Eindhoven (NL)

(73) Assignee: NXP B.V., Eindhoven (NL)

( * ) Notice: Subject to any disclaimer, the term of this patent is extended or adjusted under 35 U.S.C. 154(b) by 1542 days.

(21) Appl. No.: 10/479,089

(22) PCT Filed: May 30, 2002

(86) PCT No.: PCT/IB02/01969
§ 371 (c)(1),
(2), (4) Date: Nov. 25, 2003

(87) PCT Pub. No.: WO02/097457
PCT Pub. Date: Dec. 5, 2002

(65) Prior Publication Data
US 2004/0177314 A1    Sep. 9, 2004

(30) Foreign Application Priority Data
Jun. 1, 2001 (EP) .................................. 01202090

(51) Int. Cl.
*G06F 11/00* (2006.01)
*H03M 13/00* (2006.01)

(52) U.S. Cl.
USPC .......................................... 714/803; 714/736

(58) Field of Classification Search
USPC ................................................. 714/736, 803
See application file for complete search history.

(56) References Cited

U.S. PATENT DOCUMENTS

| 3,585,378 A * | 6/1971 | Bouricius et al. | 714/805 |
| 3,883,801 A * | 5/1975 | Hess | 714/736 |
| 4,107,649 A * | 8/1978 | Kurihara | 714/703 |
| 4,251,884 A * | 2/1981 | Baun, Jr. | 714/801 |
| 4,291,407 A | 9/1981 | Armstrong | |
| 4,312,070 A | 1/1982 | Coombes et al. | |
| 4,884,273 A * | 11/1989 | Caprasse | 714/803 |
| 4,888,715 A * | 12/1989 | Tada et al. | 714/736 |

(Continued)

FOREIGN PATENT DOCUMENTS

| CN | 88103284 A | 12/1988 |
| CN | 1151797 A | 6/1997 |

(Continued)

OTHER PUBLICATIONS

Bushnell, M. and Agrawal, V. Essentials of Electronic Test for Digital, Memory & Mixed-Signal VLSI Circuits. New York: Springer, 2000.*

(Continued)

*Primary Examiner* — Steve Nguyen

(57) ABSTRACT

The subject matter hereof relates to error detection. Various example embodiments for error defection are disclosed. In an example method of error detection in a Module UnderTest (MUT), a parity signal representing the parity of an MUT output is compared to a parity signal representing the parity of an errorless MUT output. In an example system, an Actual Parity Generator provides a parity signal representing the parity of on MUT output, a State Parity Generator provides a parity signal representing the parity of an errorless MUT output, and a comparator compares these two parity signals.

16 Claims, 3 Drawing Sheets

(56) References Cited

U.S. PATENT DOCUMENTS

Figure 1:
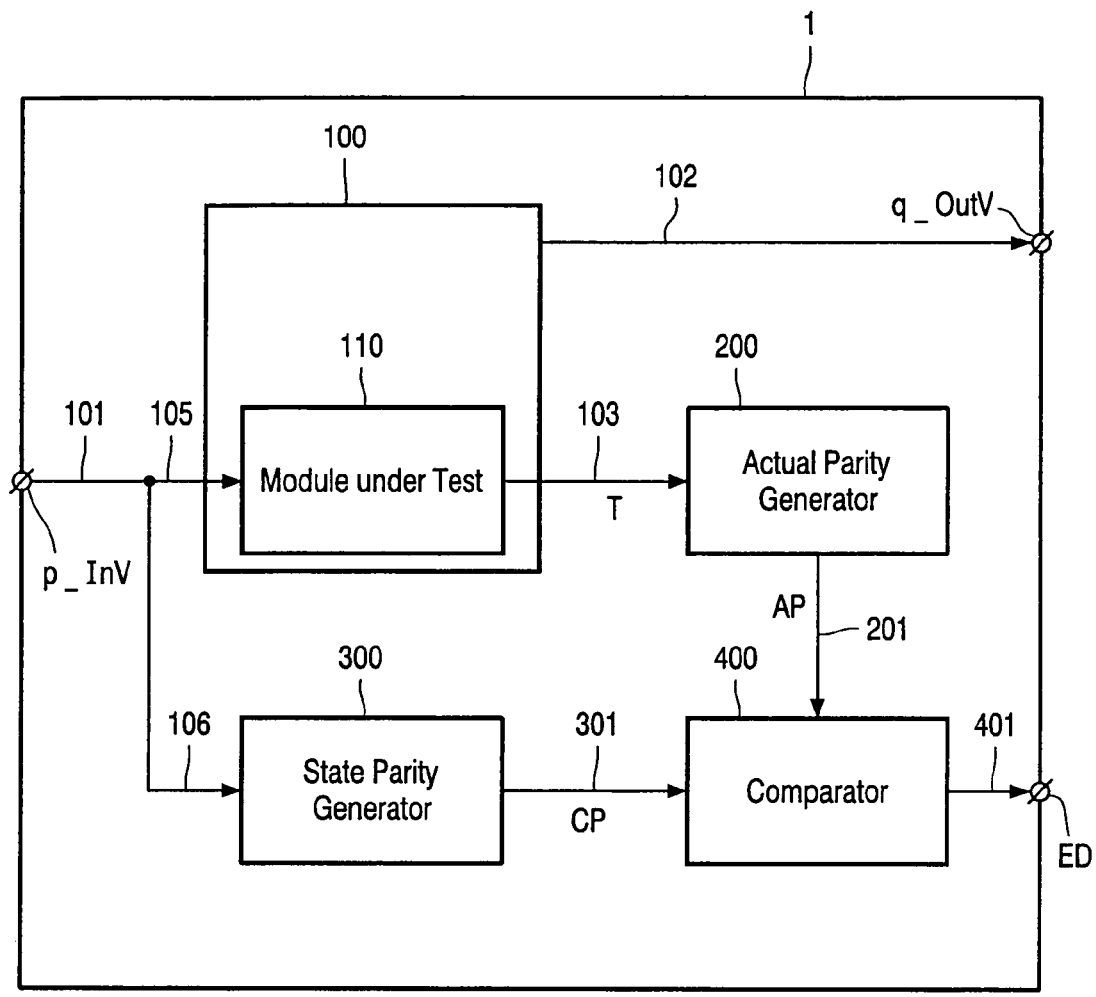

| | | | |
|---|---|---|---|
| 4,924,423 A | | 5/1990 | Vassiliadis et al. |
| 4,928,280 A | | 5/1990 | Nielson et al. |
| 5,363,382 A | * | 11/1994 | Tsukakoshi ............... 714/719 |
| 5,377,148 A | * | 12/1994 | Rajsuman ................. 365/201 |
| 5,559,506 A | | 9/1996 | Leitch |
| 5,559,813 A | | 9/1996 | Shimizu |
| 5,574,717 A | | 11/1996 | Tomizawa et al. |
| 5,857,103 A | * | 1/1999 | Grove ....................... 717/158 |
| 5,898,708 A | | 4/1999 | Tateishi et al. |
| 5,982,681 A | * | 11/1999 | Schwarz ................... 365/201 |
| 6,308,292 B1 | * | 10/2001 | Fusco ....................... 714/738 |
| 6,718,494 B1 | * | 4/2004 | Jamil et al. ............... 714/723 |
| 7,117,463 B2 | * | 10/2006 | Graham et al. ............... 716/5 |
| 2002/0013919 A1 | | 1/2002 | Kleihorst et al. |

FOREIGN PATENT DOCUMENTS

| | | |
|---|---|---|
| EP | 0339296 | 11/1989 |
| JP | 63204170 A | 8/1988 |
| JP | 1187475 A | 7/1989 |
| JP | 5324375 A | 12/1993 |
| WO | 8809968 A1 | 12/1988 |

OTHER PUBLICATIONS

Fujiwara E: "A self-testing group-parity prediction checker and its use for built-in testing" International symposium on fault tolerant computing systems. (FTCS). Milano, Jun. 28-30, 1983, Silver Spring, IEEE Comp. Soc. Press, US, vol. Symp. 13, Jun. 1, 1983, pp. 146-153, XP000748595.

Khodadad-Mostashiry, "Parity Prediction in Combinational Circuits" appeared in Proceedings of the International Symposium on Fault-Tolerant Computing, pp. 185-188, 1979.

Metra, "Self-checking Detection and Diagnosis of transient, delay and cross-talk faults affecting bus-lines", IEEE transactions on computers, No. 6 2000.

Chaohuang Zeng et al., "Finite State Machine Synthesis With Concurrent Error Detection," Test Conference, International Proceedings, Sep. 1999.

* cited by examiner

DIGITAL SYSTEM AND A METHOD FOR ERROR DETECTION THEREOF

The subject matter of this disclosure relates to error detection. The subject matter of this disclosure relates further to error detection in digital systems. The subject matter of this disclosure further relates to a method for error detection in digital circuits.

Error detection and correction in Very Large Scale Integrated (VLSI) digital circuit is a very important issue and, in the same time it is a very hard task. But even if an integrated circuit is very well tested, errors caused especially by environmental factors as excessive temperature, radiation, could appear at a later stage during it's normal duty time. In this case, the circuit must, at least, detect these errors and transmit a warning signal. It must be pointed out here that in case of a VLSI circuit the probability that at least one error occurs is relatively high and therefore a method for detecting at least one error is desirable.

Such a method is known from the paper "Parity Prediction In Combinational Circuits" appeared in Proceedings of the International Symposium on Fault-Tolerant Computing, pp. 185-188, 1979. In this prior art, a method for parity prediction in combinational circuits is described. The method considers a special case of circuit duplication, which is another well-known method for fault detection in digital circuits. In fact, as it is pointed out in the conclusions of the above mentioned paper, the main advantage of this method lies in input error preserving. It should be mentioned here that the circuit duplication in VLSI, it is almost impossible because of the area overhead involved in the process, even in the particular form described in said prior art.

It is therefore an object of the present invention to providing a testing system and a method for error detection in VLSI digital circuits that lower the necessary area overhead.

In accordance with the invention, this object is achieved in that the digital system further comprises a State Parity Generator (SPG) having a sixth input terminal coupled to the input terminal and a sixth output terminal coupled to the fifth input terminal, the SPG generating the other parity signal of an equivalent with respect to parity of the module under test, the other parity signal being generated from the digital input vector p_InV.

An equivalent with respect to parity of the module under test is a combinational circuit that is driven by the digital input vector p_InV and generates at its output the parity of the transfer function of the module under test.

The module under test could be either a part of the digital processing unit or could be identical thereto. In the same time, the second output vector T could be the same as the q_OutV, or they could coincide partially or could be totally different from each other. The output vector T may comprise signal components which are not a part of the output vector q_OutV, but which are indicative of the state of the processing unit. Preferably, the components of the output vector T are signals which occur during the processing of generating the output vector q_OutV from the input vector p_InV, so that no unnecessary overhead is introduced.

The device according to the invention has the advantage of lowering area overhead when one error detection circuit is provided. It does not duplicate the circuit, which in case of the VLSI circuits is impracticable and, furthermore, it is very flexible because it can be used to testing not only the output vectors of the processing unit but also state variables that are not outputted by the processing unit. Furthermore, the area overhead can be further optimized by partitioning the digital processing unit and choosing the equivalent with respect to parity circuit that involves an as low as possible area overhead.

In an embodiment of the invention the SPG comprises a plurality of combinatorial digital devices, being implemented using two level logic design i.e. sum of product terms or product of sum terms. This implementation is very suitable to be implemented in VLSI programmable logic devices and can provide low delay times through the SPG. It should be emphasized here that depending on the VLSI programmable logic device (PLD) architecture other combinational implementations could be considered as Muller expansions, multiplexers and demultiplexers etc.

In another preferred embodiment of the present invention the Actual Parity Generator (APG) is conceived to realize the digital function $T1 \oplus T2 \oplus \ldots \oplus Tr$. The APG is implemented with XOR gates in a configuration called Parity Tree (PT), but depending on the PLD architecture it could be implemented using logical gates other than XOR, multiplexers, demultiplexers, memories.

It is another object of the present invention to provide a method for error detection in a module under test comprised in a digital processing unit comprising generating a digital output vector q-OutV from a digital input vector p_InV by means of a targeted digital transfer function (TDTF) implemented in the digital processing unit, providing a binary vector T in response to the digital input vector p_InV, the vector T being representative of a state of the module under test, generating an output signal AP representing the parity of the vector T, generating an another parity signal CP in response to the digital input vector p_InV, the another parity signal CP representing the parity of an equivalent with respect to parity of the module under test, comparing the signal AP with the signal CP, generating a binary signal ED, the signal ED indicating whether the signal CP equals the signal AP.

In any digital design process it is necessary to specify an input vector and a desired state vector that represents, normally, the next state of the module under test circuit. From the next state of the module under test circuit a parity bit is provided. The parity bit is set in a first logical state e.g. logical 0 or Low (L) if there is an even number of bits with value 1 in the state vector. The parity bit is set in a second logical state e.g. logical 1 or High (H) if there is an odd number of bits with value 1 in the state vector.

Using the input vector and the parity bits of the state vector a combinational circuit implementing this parity function is designed using but not being limited to a standard computer aided design program.

It should be pointed out here that the vast majority of the digital circuits does not implement complete specified functions i.e. generally not all the $2^n$ input combinations of an n dimensional input vector are used. In this case the unused combinations are used either to generate a warning signal or to generate a transition to a predetermined state.

In a preferred embodiment of the present invention the SPG is conceived to realize a digital transfer function having as input all possible p_InV vectors and as output a signal (CP) characterizing the parity of the desired T vector and the unused states of the input vector p_InV. A warning circuit is designed to generate a warning signal W if an unused combination is detected. The warning signal W is further treated by the system in the same way as the error generated by the parity error detection.

Figure 2:
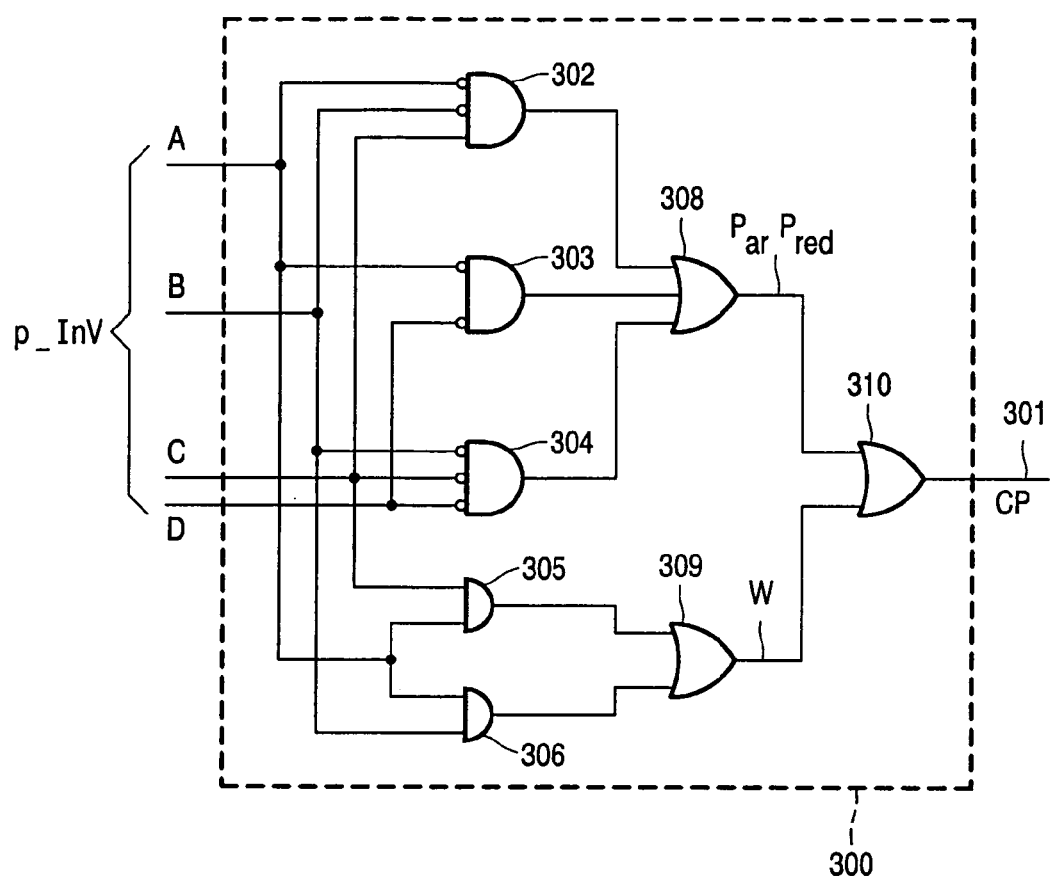
Figure 3:
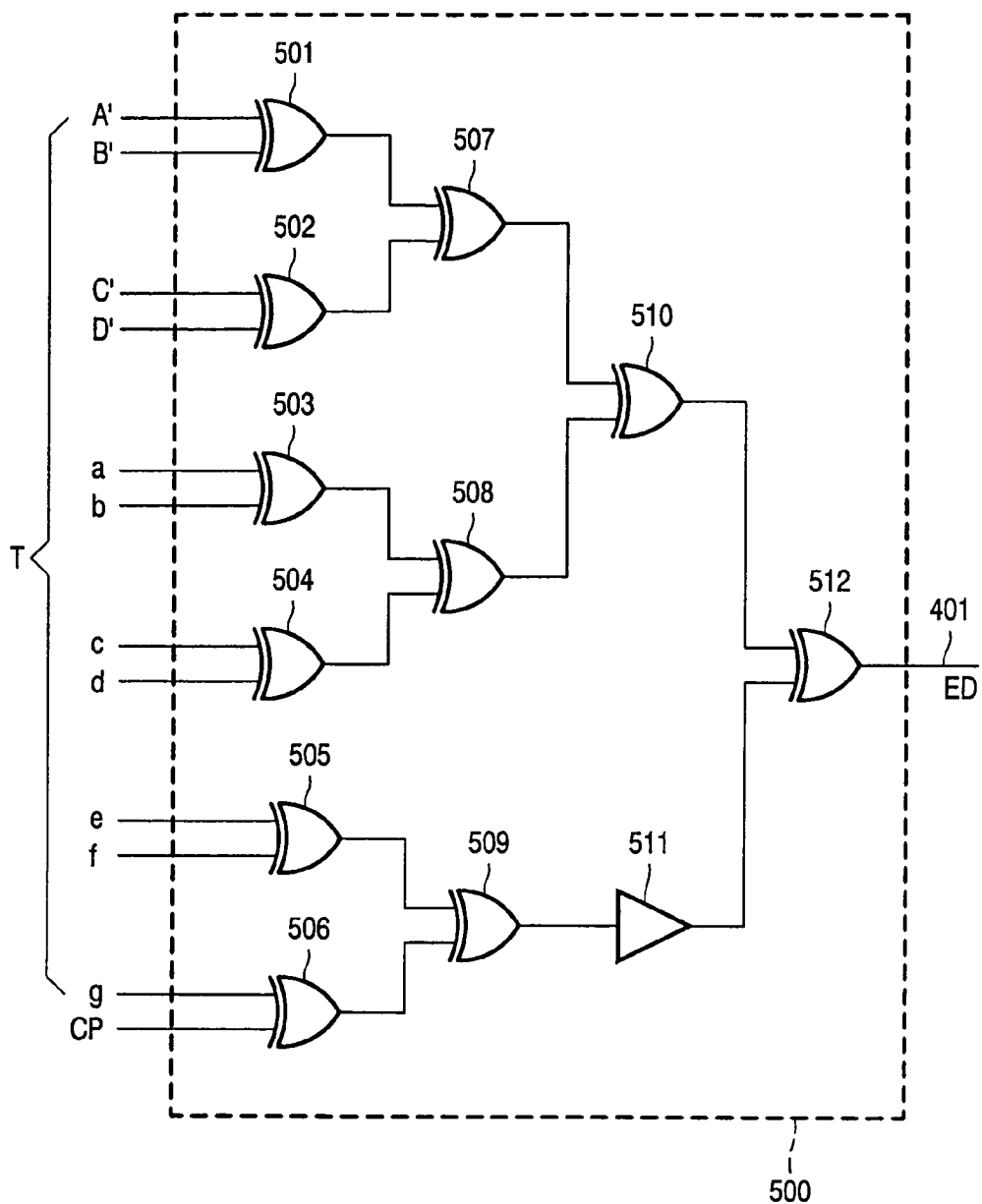

The above and other features and advantages of the invention will be apparent from the following description of exemplary embodiments of the invention with reference to the accompanying drawings, in which:

FIG. 1 depicts a block diagram of a digital system 1 that is tested in accordance with an embodiment of the present invention, FIG. 2 represents a State Parity Generator (SPG) circuit in another embodiment of the invention, FIG. 3 represents a parity tree generator and a comparator in another embodiment of the invention.

FIG. 1 shows the block diagram of a digital system 1 that is tested in accordance to the present invention. The digital system 1 is conceived for processing at a time moment determined by a clock (Ck) signal a digital input vector (p_InV) comprising p bits (I1, I2, ..., Ip) for providing a digital output vector (q_OutV) comprising q bits (O1, O2, ..., Oq). The digital system 1 further comprises a first input terminal 101 for receiving the p_InV and a first output terminal 102 for transmitting the q_OutV, the digital system 1 further has a digital processing unit 100 comprising a Module under Test 110, an Actual Parity generator 200, a Comparator 400 and a State parity generator (SPG) 300. A coupling between terminals could be realized in several ways e.g. as a wired or a wireless connection as e.g. by an inductive, capacitive, optical coupling or a radio connection.

The digital processing unit 100 is coupled to the first input terminal 101 for processing the p_InV for realizing a targeted digital transfer function (TDTF) and for providing the output vector q_OutV obtained with the TDTF to the first output terminal 102. The digital-processing unit 100 further comprises the Module under Test 110 having a second input terminal 105 coupled to the first input terminal 101 and a second output terminal 103 for providing a digital vector T having r bits (T1, T2, ..., Tr). It should be pointed out here that in a particular implementation the Module under Test 110 and the digital-processing unit 100 could be identical to each other. Furthermore, some of the bits from vector T, if not all of them and some of the bits of the q_OutV could be the same i.e. the output vector T may partly or wholly coincide with the output vector q_OutV.

The Actual Parity Generator 200 comprises a third input terminal coupled to the second input terminal 103 for generating at a third output terminal 201 an output signal AP representing the parity of the vector T.

The SPG 300 comprises a sixth input terminal 106 coupled to the input terminal 101 and a sixth output terminal 301 coupled to a fifth input terminal being conceived for generating an other parity signal CP.

The comparator 400 comprises a fourth input terminal coupled to the third output terminal 201. It's fifth input terminal is coupled to the sixth output terminal. The comparator provides an output signal ED at a seventh output terminal 401 which indicates whether the input signal AP provided at the third output terminal equals the other parity signal CP.

The SPG 300 is an equivalent with respect to parity of the module under test 110 meaning that it realizes a binary or digital function having p_InV as input and generating the desired parity of the T vector.

Normally when a digital function is synthesized a table as Table 1 is used. In Table 1 State represents an output state determined by the input vector p_InV and

TABLE 1

| p_InV | State | Parity |
|-------|-------|--------|
| I1I2...Ip | T1T2...Tr | CP |

Parity represents the parity of the vector T. The parity of the vector is a digital function that has a first binary value when the vector T comprises an odd number of bits in logical high (H) state and has the dual binary value when the vector T comprises an even number of bits in logical H state.

The design process comprises steps of synthesizing digital functions $T1=T1(p\_InV), T2=T2(p\_InV), \ldots, Tr=Tr(p\_InV)$ and $CP=CP(p\_InV)$. It is further observed that using Table 1 the parity of the state is uniquely associated to the digital input vector and that the State parity generator 300 is very simply in structure being a combinatorial circuit. Anyhow, such a combinatorial circuit is significantly simpler than a circuit that duplicates the Module under Test 110.

When the circuit is implemented in a programmable logic device, the area overhead due to the realization of the state parity generator 300 is relatively low.

It should be pointed out here that the vast majority of digital circuits does not implement complete specified functions i.e. not all the $2^p$ input combinations of a p dimensional input vector p_InV are used. In this case the unused combinations are used either to generate a warning signal or to generate a transition to a predetermined state.

In a preferred embodiment of the present invention, a warning circuit is included for generating a warning signal W when an unused combination of the input vector p_InV is detected. The warning signal W is treated by the system in the same way as the error generated by the parity error detection is, the warning circuit being comprised in the SPG 300.

Let us consider the digital function described in Table 2. In Table 2 the input vector p_InV comprises 4 bits [A, B, C, D] and the state bits characterizing the vector T comprises 11 bits [A', B', C', C', a, b, c, d, e, f, g]. The vector q_OutV also comprises the bits [a, b, c, d, e, f, g]. The bits A B C D are included in the vector T but are not included in the digital output vector q_OutV. The bits noted with 'x' represent don't care bits, that is, they can be either logical H or logical L. It is further observed that the circuit described in Table 2 realizes an incompletely defined logical function. Hence, it is necessary to generate a warning signal W when the unused input codes appear at the input. In this situation the digital signal CP=ParPred+W, where "+" means logical OR function.

TABLE 2

| p_InV | State | Parity | Warning signal |
|-------|-------|--------|----------------|
| ABCD | A'B'C'D'abcdefg | ParPred | W |
| 0000 | 00010010010 | 1 | 0 |
| 0001 | 00101011101 | 0 | 0 |
| 0010 | 00111011011 | 1 | 0 |
| 0011 | 01000111010 | 1 | 0 |
| 0100 | 01011101011 | 1 | 0 |
| 0101 | 01101101111 | 0 | 0 |
| 0110 | 01111110010 | 1 | 0 |
| 0111 | 10001111111 | 0 | 0 |
| 1000 | 10011111010 | 1 | 0 |
| 1001 | 00001110111 | 0 | 0 |
| 1010 | xxxxxxxxxxx | 0 | 1 |
| 1011 | xxxxxxxxxxx | 0 | 1 |
| 1100 | xxxxxxxxxxx | 0 | 1 |
| 1101 | xxxxxxxxxxx | 0 | 1 |
| 1110 | xxxxxxxxxxx | 0 | 1 |
| 1111 | xxxxxxxxxxx | 0 | 1 |

The resulting digital functions are as follows:

$$A' = BCD + \overline{D}A$$

$$B' = \overline{B}CD + \overline{C}B + \overline{D}B$$

$$C' = \overline{A}CD + \overline{D}C$$

$$D' = \overline{D}$$

$$a = \overline{D}C + B + \overline{C}D + A$$

$$b = CD + B + A$$

$$c = C + \overline{B}$$

$$d = \overline{D}A + \overline{B}C + \overline{A}D + \overline{C}B$$

$$e = BD + \overline{C}D$$

$$f = A + \overline{D} + C + B$$

$$g = \overline{B}\overline{D}C + \overline{C}B + BD + \overline{C}D$$

$$ParPred = \overline{A}\overline{B}C + \overline{B}\overline{C}D + \overline{A}D$$

$$W = AC + AB$$

It must be pointed out here that the implementation of the functions a . . . g described in Table 2, without ParPred and W, comprise, if they are implemented with logical gates, 28 gates while the implementation of the state parity generator 300 for generating the signal CP comprises only 8 gates. It is obvious that the method for detecting errors in digital circuits described in present application reduces the circuit overhead substantially in comparison with any other method involving duplication of the circuit known from prior art. It is observed that in the digital system 1 described in Table 2 the module under test 110 and the digital processing unit 100 coincide with each other but have different output vectors. The output vector q_OutV=[a, b, c, d, e, f, g] is included in vector T=[A', B', C', D', a, b, c, d, e, f, g].

It is further observed that if a set of completely defined functions is realized a warning signal W is superfluous. In that case the SPG 300 comprises only the implementation of ParPred function and CP=ParPred.

Furthermore, the signal W could be used in various ways as e.g. blocking the fourth input of the comparator 400, which is coupled to the third output terminal 201 of the Actual Parity Generator 200. Preferably blocking has the effect that the signal ED equals the signal W, in a hierarchical decision tree at a well-defined priority level in order to take decisions when an unused input vector appears.

It is further mentioned here that, depending on the VLSI programmable device used, the functions described in Table 2 could be implemented optimally either with logical gates or with medium scale circuits as multiplexers, demultiplexers, memories or combinations thereof.

FIG. 2 depicts a SPG 300 circuit in another embodiment of the invention. The SPG 300 corresponds to the preferred embodiment described in the Table 2. The SPG 300 comprises a first set of logical gates [302, 303, 304, 308] generating the signal ParPred and a second set of logical gates [305, 306, 309] generating the signal W. OR gate 310 generates the signal CP that is further used in the error detection process.

It is be observed that the SPG 300 could be implemented either on the same chip as the digital system 1 or on a separate one. Furthermore, the signal CP could be generated by a separate testing system controlled by a computer program.

FIG. 3 depicts an embodiment of the Actual Parity Generator 200 and of the Comparator 400, the resulting module being labeled 500. The module 500 comprises a set of XOR gates and a buffer 511 connected in a well-known configuration named parity tree circuit. The parity tree realize the logical function $$ED = A' \oplus B' \oplus C' \oplus D' \oplus a \oplus b \oplus c \oplus d \, e \oplus f \oplus CP \qquad (1)$$

generating at it's output terminal 401 the signal ED indicating when it has the logical value 1 that an error occurred in the module under test. The buffer circuit 511 is used here to balance the delays of any input signal from the input to the output.

Preferably the block 500 is implemented on the same chip as the module under test circuit and implementing the relation (1). It is understood that the implementation in FIG. 3 is not the unique possible one, the most important aspect being that the output signal ED is generated by the Boolean function ED=T⊕CP.

It is remarked that the scope of protection of the invention is not restricted to the embodiments described herein. Neither is the scope of protection of the invention restricted by the reference numerals in the claims. The word 'comprising' does not exclude other parts than those mentioned in a claim. The word 'a(n)' preceding an element does not exclude a plurality of those elements. Means forming part of the invention may both be implemented in the form of dedicated hardware or in the form of a programmed general-purpose processor. The invention resides in each new feature or combination of features.

The invention claimed is:

1. A digital system, the digital system having a digital input vector, the digital system comprising:
   a first terminal for receiving the digital input vector;
   a digital processing unit coupled to the first input terminal, the digital processing unit processing the digital input vector, the digital processing unit comprising a Module under Test, the Module under Test having a second input terminal coupled to the first input terminal and having a second output terminal, the Module under Test being responsive to the digital input vector by (a) providing a responsive digital vector in response to the digital input vector;
   an Actual Parity Generator having a third input terminal coupled to the second output terminal and having a third output terminal, the Actual Parity Generator providing, at the third output terminal, an actual parity signal representing the parity of the responsive digital vector;
   a State Parity Generator having a sixth input terminal coupled to the first input terminal and having a sixth output terminal, the State Parity Generator arranged to provide (a) responsive to the digital input vector causing the Module under Test to enter at least one used state, a representative parity signal representative of the parity of an errorless digital vector predetermined for at least one used state of the Module under Test and (b) responsive to the digital input vector causing the Module under Test to enter at least one unused state, a selected signal characterizing the unused state; and
   a comparator having a seventh output terminal, having a fourth input terminal coupled to the third output terminal for receiving the actual parity signal and having a fifth input terminal coupled to a sixth output terminal for receiving the representative parity signal, the comparator realizing a digital comparison between the actual parity signal and the representative parity signal and providing a comparator output signal at the seventh output, the comparator output signal terminal being a function of the realized digital comparison and the selected signal and indicative of a potential error associated with the Module under Test.

2. A digital system as claimed in claim 1, wherein the digital processing unit consists of the Module under Test.

3. A digital system as claimed in claim 1, wherein, responsive to the digital input vector, the digital processing unit provides a digital output vector having one or more components, at least one of said one or more components being comprised in the responsive digital vector.

4. A digital system as claimed in claim 3, wherein each of the components of the digital output vector are present in the responsive digital vector.

5. A digital system as claimed in claim 1, wherein the State Parity Generator provides a signal comprising a logical combination of the representative parity signal and the selected signal.

6. A digital system as claimed in claim 1, wherein, in response to an unused state, the State Parity Generator provides the selected signal so as to comprise at least one of (a) a warning signal associated with the unused state and (b) a transition signal associated with a transition to a predetermined state responsive to the unused state.

7. A digital system as claimed in claim 1, wherein, in the event of an unused state, the comparator provides, at the seventh output terminal, a signal indicative of the Module under Test being subject to the unused state.

8. A digital system as claimed in claim 7, wherein, in the event of the unused state, the comparator provides, at the seventh output terminal, at least one of (a) a comparator output signal representative of the selected signal and (b) the selected signal.

9. A digital system as claimed in claim 1, wherein the comparator and Actual Parity Generator are implemented integrally in combinatorial digital devices, the combinatorial digital devices having inputs that comprise at least the responsive digital vector and the representative parity signal.

10. In a digital system having a digital input vector, a method for error detection in a module under test, the method comprising:
providing, from the Module under Test, a responsive digital vector in response to the digital input vector;
providing, responsive to the digital input vector, (a) a representative parity signal representative of the parity of an errorless digital vector predetermined for an expected responsive digital vector from the Module under Test, and (b) a selected signal characterizing whether a state caused by the digital input vector is used by the Module under Test;
generating, at least in response to the state being used by the Module under Test, an actual parity signal representing the parity of the responsive digital vector;
comparing, at least in response to the state being used by the Module under Test, the actual parity signal with the representative parity signal; and
providing, responsive to the selected signal and to comparing the actual parity signal with the representative parity signal, a comparator output signal indicative of a potential error associated with the Module under Test.

11. The method of claim 10, further comprising implementing, using logic representing a combined state-based response, (i) providing the actual parity signal and (ii) comparing the actual parity signal with the representative parity signal.

12. The method of claim 10, wherein, in response to the digital input vector being associated with an unused state, providing the selected signal comprises providing at least one of (a) a warning signal associated with the unused state and (b) a transition signal associated with a transition to a predetermined state responsive to the unused state.

13. The method of claim 12, further comprising, in response to the in response to the digital input vector being associated with an unused state, blocking the comparing, and outputting at least the warning signal either in place of, or as, the comparator output signal.

14. A digital system, comprising:
a Module under Test, the Module under Test providing a responsive digital vector in response to a digital input vector;
a State Parity Generator, the State Parity Generator providing, responsive to a state of the digital system caused by the digital input vector, a responsive signal representative of one or more of (a) a parity signal representative of an errorless digital vector predetermined for the state, (b) a warning signal indicative of whether the state caused by the digital input vector is used by the Module under Test, (c) a transition signal associated with a transition to a predetermined state responsive to the state caused by the digital input vector, and (d) any combination of the parity signal, the warning signal and the transition signal;
an error detection circuit, the error detection circuit providing, responsive to the responsive signal and the responsive digital vector, an error signal indicative of a potential error associated with the Module under Test; and
wherein, responsive to the state caused by the digital input vector, the error detection circuit provides an error signal indicating that the Module under Test is subject to an unused state.

15. A digital system as claimed in claim 14, wherein, responsive to the warning signal, the error detection circuit provides the warning signal as the error signal.

16. A digital system as claimed in claim 14, wherein the error detection circuit provides the error signal by XORing the components of the responsive digital vector and at least selected components of the responsive signal.

* * * * *